(12) United States Patent
Shako et al.

(10) Patent No.: US 7,447,274 B2
(45) Date of Patent: Nov. 4, 2008

(54) DISTORTION COMPENSATION APPARATUS

(75) Inventors: Hideharu Shako, Kawasaki (JP); Yasuhito Funyu, Kawasaki (JP); Takeshi Ohba, Kawasaki (JP)

(73) Assignee: Fujitsu, Limited, Kawasaki (JP)

( * ) Notice: Subject to any disclaimer, the term of this patent is extended or adjusted under 35 U.S.C. 154(b) by 451 days.

(21) Appl. No.: 11/169,899

(22) Filed: Jun. 30, 2005

(65) Prior Publication Data

US 2006/0209983 A1   Sep. 21, 2006

(30) Foreign Application Priority Data

Mar. 16, 2005   (JP) .............................. 2005-075547

(51) Int. Cl.
*H04L 25/49* (2006.01)
(52) U.S. Cl. ..................................... 375/296
(58) Field of Classification Search ......... 332/123–125, 332/149–161, 117; 375/295–297, 285; 455/91, 455/114.2, 114.3
See application file for complete search history.

(56) References Cited

U.S. PATENT DOCUMENTS 5,404,378 A * 4/1995 Kimura ...................... 375/296
6,836,517 B2   12/2004 Nagatani et al. ............ 375/296
2003/0112891 A1 * 6/2003 Ozaki .......................... 375/296
2008/0003958 A1 * 1/2008 Ohba et al. ................. 455/106

FOREIGN PATENT DOCUMENTS

JP           2001-89685         7/2001
WO       WO 03/103163       12/2003

* cited by examiner

*Primary Examiner*—Tesfaldet Bocure
(74) *Attorney, Agent, or Firm*—Hanify & King, P.C.

(57) ABSTRACT

Provided is a distortion compensation apparatus to prevent divergence of distortion compensation coefficients caused by an abnormal distortion compensation coefficient value. The distortion compensation apparatus includes a storage for storing a distortion compensation coefficient in a specified write address, and outputting a distortion compensation coefficient stored in a specified readout address; a predistortion portion for performing distortion compensation processing onto a transmission signal, using the distortion compensation coefficient being output from the storage; and a distortion compensator for calculating a distortion compensation coefficient based on the transmission signal before the distortion compensation processing and the transmission signal after being amplified by an amplifier. The distortion compensator further reads out the distortion compensation coefficients stored in the storage, extracts a distortion compensation coefficient satisfying a predetermined condition, and performs correction processing to reduce the amplitude of the extracted distortion compensation coefficient.

7 Claims, 11 Drawing Sheets

DISTORTION COMPENSATION APPARATUS

BACKGROUND OF THE INVENTION

1. Field of the Invention

The present invention relates to a predistortion compensation apparatus, performing distortion compensation processing in advance on a transmission signal before amplification.

2. Description of the Related Art

In recent years, high-efficient digital transmission has widely been adopted in radio communication. When multi-level phase modulation is adopted in the radio communication, it is an important technique to suppress nonlinear distortion by linearizing the amplification characteristic of a power amplifier on the transmission side, so as to reduce adjacent channel leak power.

Also, when it is intended to improve power efficiency using an amplifier having a degraded linearity, a technique for compensating nonlinear distortion caused by the degraded linearity is essentially required.

Figure 1:
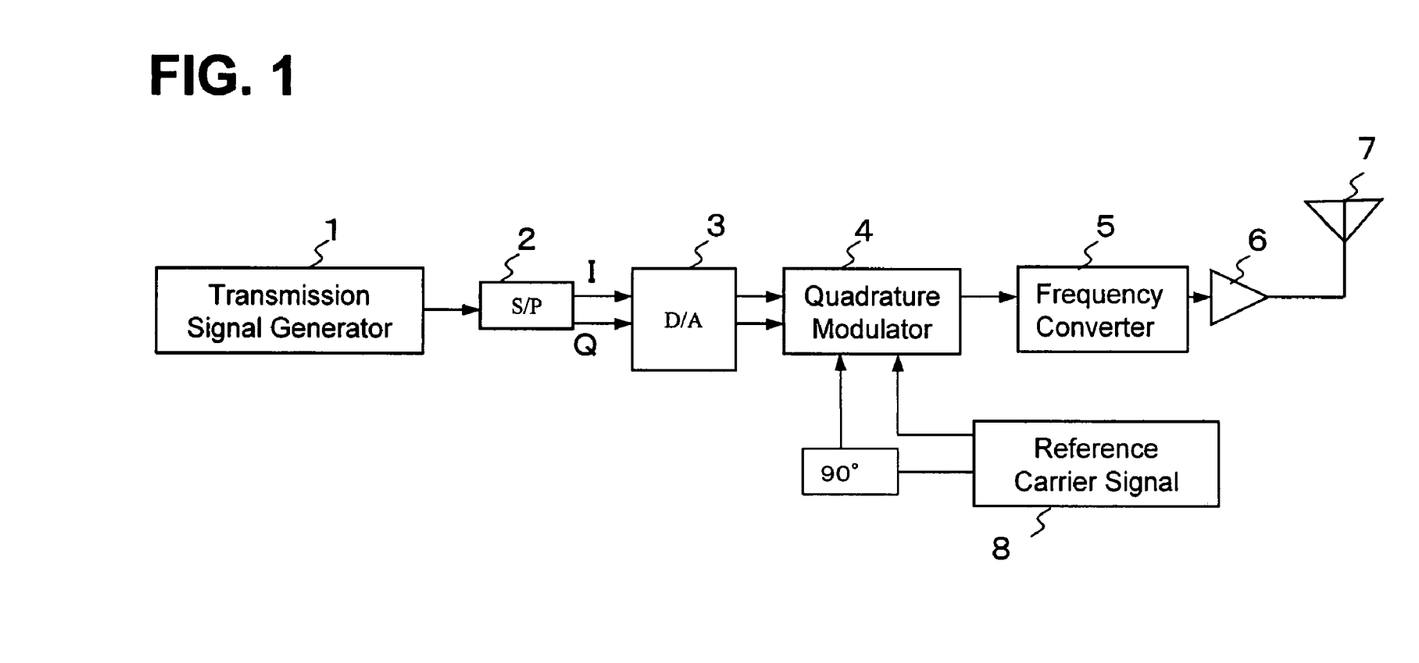
FIG. 1 shows a block diagram illustrating one example of transmission equipment in the conventional radio equipment.

FIG. 1 shows an exemplary block diagram of transmission equipment in the conventional radio equipment. A transmission signal generator 1 outputs a digital serial data sequence. A serial-to-parallel (S/P) converter 2 then converts the digital data sequence into two series, in-phase component signals (I-signals) and quadrature component signals (Q-signals), by alternately distributing the digital data sequence on a bit-by-bit basis.

A digital-to-analog (D/A) converter 3 converts the I-signal and the Q-signal into an analog baseband signal, respectively, so as to input into a quadrature modulator 4. This quadrature modulator 4 multiplies the input I-signal and Q-signal (a baseband transmission signal) by a reference carrier wave 8, and a carrier wave phase-shifted by 90° from the reference carrier wave 8, and adds the multiplied results, thus performing orthogonal transformation, and outputs the above signal.

A frequency converter 5 mixes the quadrature modulation signal with a local oscillation signal, and converts the mixed signal into a radio frequency. A transmission power amplifier 6 performs power amplification of the radio frequency signal being output from frequency converter 5, and radiates to the air from an antenna 7.

Figure 2:
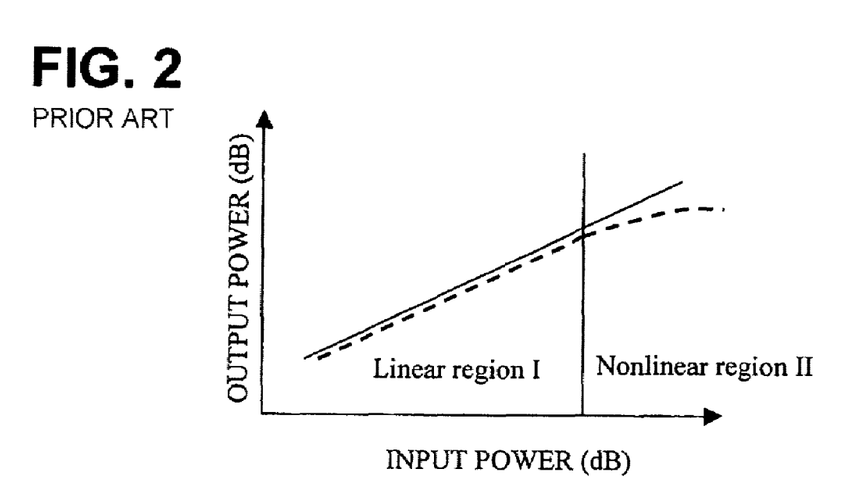
FIG. 2 shows a diagram illustrating input/output characteristics (having distortion function f(p)) of a transmission power amplifier.

Here, in the mobile communication using W-CDMA, etc., transmission equipment power is substantially large, as much as 10 mW to several tens of mW, and the input/output characteristic (having a distortion function f(p)) of transmission power amplifier 6 shows non-linearity, as shown by the dotted line in FIG. 2. This nonlinear characteristic produces a nonlinear distortion. As shown by the solid line (b) in FIG. 3, the frequency spectrum in the vicinity of a transmission frequency $f_0$ comes to have a raised sidelobe, shifted from the characteristic shown by the broken line (a) in FIG. 3. This produces a leak to adjacent channels, resulting in adjacent channel interference. Namely, due to the nonlinear distortion shown in FIG. 2, the leak power of the transmission wave to the adjacent frequency channels becomes large, as shown in FIG. 3.

Figure 3:
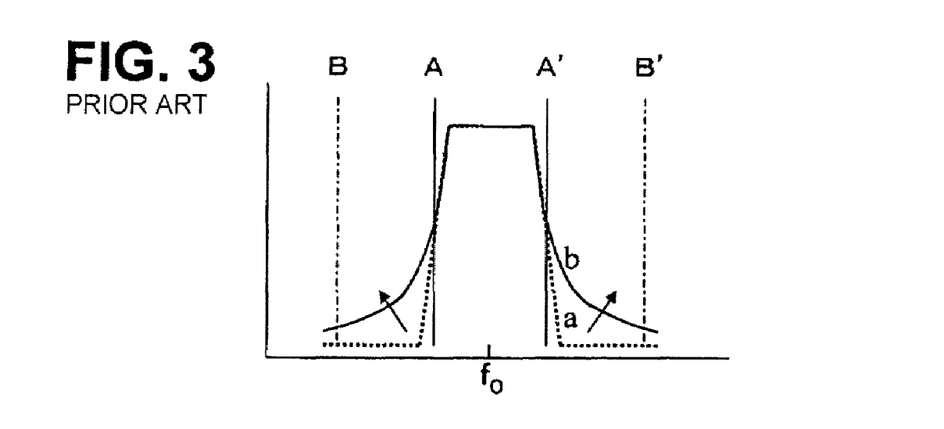
FIG. 3 shows a diagram illustrating a nonlinear distortion produced by the nonlinear characteristic.

An ACPR (adjacent channel power ratio) represents the magnitude of leak power, being defined as a ratio of leak power to adjacent channels, which corresponds to a spectrum area in the adjacent channels sandwiched between the lines B and B' in FIG. 3, to the power in the channel of interest, which corresponds to a spectrum area between the lines A and A'. Such the leak power affects other channels as noise, and degrades the communication quality of the channel of interest. For this reason, a strict regulation has been established.

The leak power is substantially small in a linear region of, for example, a power amplifier (refer to a linear region I in FIG. 2), and is substantially large in a nonlinear region II. Accordingly, in order to obtain a high-output transmission power amplifier, the linear region I has to be widened. However, this requires an amplifier having a larger capacity than is actually needed, which causes a disadvantageous problem in both cost and size of the apparatus. To cope with this problem, it has been applied to add a distortion compensation function to radio equipment so as to compensate for the transmission power distortion.

Figure 4:
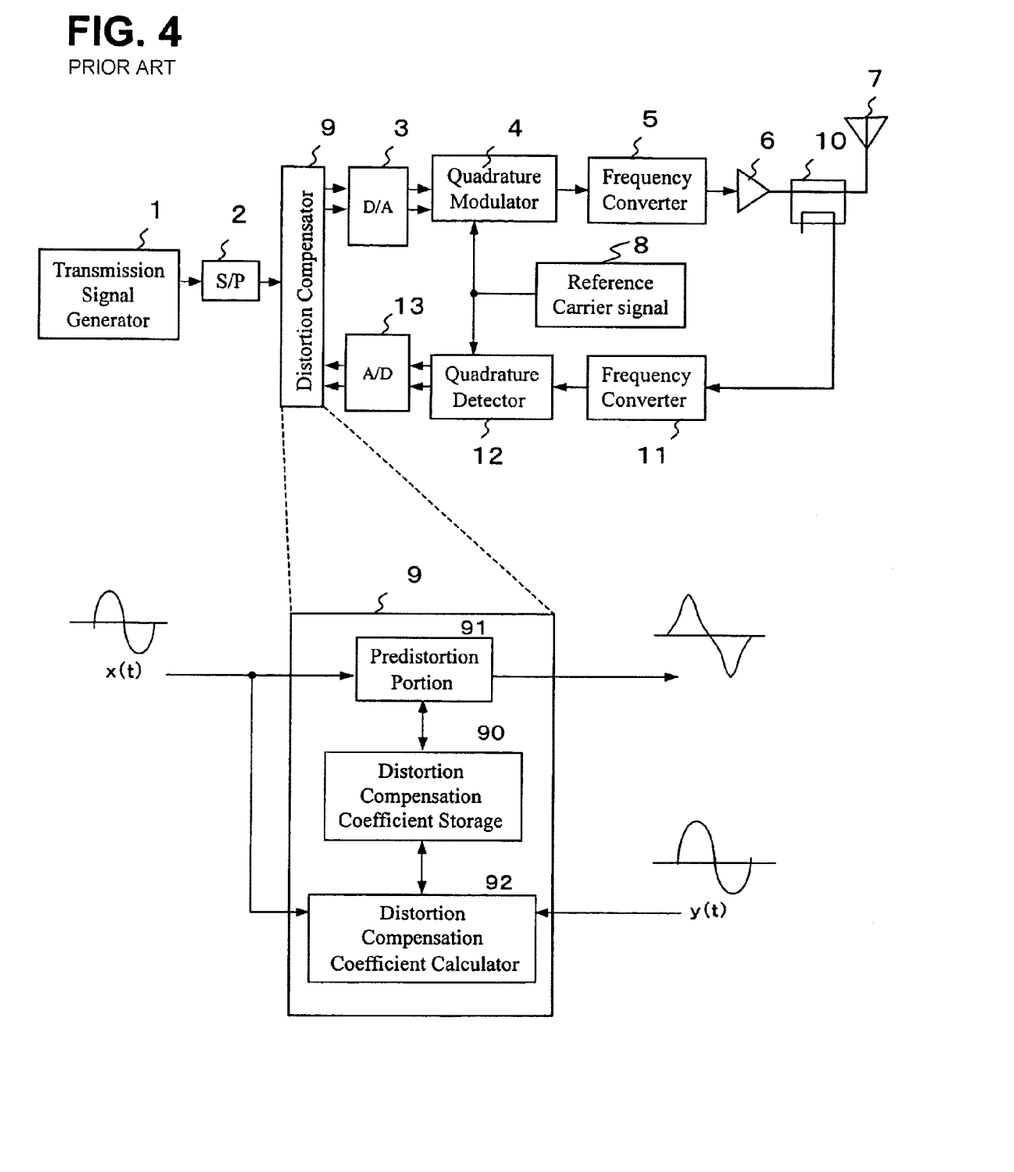
FIG. 4 shows a block diagram of transmission equipment having a digital nonlinear distortion compensation function using a DSP (digital signal processor).

FIG. 4 shows a block diagram of transmission equipment having a digital nonlinear distortion compensation function. A digital data group (transmission signals) transmitted from transmission signal generator 1 is converted in S/P converter 2 into two series, I-signals and Q-signals. The two signal series are then input to a distortion compensator 9, which is configured of a DSP (digital signal processor) as a preferable example.

As shown in the lower part of FIG. 4 in enlargement, distortion compensator 9 includes: a distortion compensation coefficient storage 90 for storing a distortion compensation coefficient h(pi) corresponding to the power level pi (where, i=0–1023) of a transmission signal x(t); a predistortion portion 91 for performing a distortion compensation process (predistortion) onto the transmission signal, using the distortion compensation coefficient h(pi) corresponding to the transmission signal power level; and further, a distortion compensation coefficient calculator 92 for updating a distortion compensation coefficient in distortion compensation coefficient storage 90, by comparing the transmission signal x(t) with a demodulation signal (a feedback signal) y(t) demodulated in a quadrature detector 12, which will be described later, and calculating the distortion compensation coefficient h(pi) so that the difference between the above compared values becomes zero.

The signal on which the predistortion process is performed in distortion compensator 9 is input into D/A converter 3. D/A converter 3 converts the input I-signal and Q-signal into analog baseband signals, and inputs the converted signals into quadrature modulator 4. Quadrature modulator 4 performs quadrature modulation by multiplying the input I-signal and Q-signal by a reference carrier wave 8 and a carrier wave being phase-shifted by 90° from reference carrier wave 8, respectively. Quadrature modulator 4 performs quadrature modulation by adding the multiplication result, and outputs the modulated signal.

A frequency converter 5 performs frequency conversion by mixing the quadrature modulation signal with a local oscillation signal. A transmission power amplifier 6 performs power amplification of the radio frequency signal being output from frequency converter 5, and radiates to the air from antenna 7.

A portion of the transmission signal is input to a frequency converter 11 via a directional coupler 10, and input into a quadrature detector 12 after being frequency converted by the above frequency converter 11. Quadrature detector 12 performs quadrature detection by multiplying the input signal by a reference carrier wave, and by a signal being phase-shifted by 90° from the reference carrier wave, respectively. Thus, the baseband I-signal and Q-signal on the transmission side are reproduced, and then input into an analog-to-digital (A/D) converter 13.

A/D converter 13 converts the input I-signal and Q-signal into digital signals, and inputs into distortion compensator 9. Through the adaptive signal processing, using an LMS (least-mean-square) algorithm, in distortion compensation coefficient calculator 92 of distortion compensator 9, the pre-compensated transmission signal is compared with the feedback signal being demodulated in quadrature detector 12. Then, distortion compensator 9 calculates the distortion compensation coefficient h(p1) so that the difference of the above comparison values becomes zero, and updates the above-obtained coefficient having been stored in distortion compensation coefficient storage 90. Through the repetition of the calculations above, nonlinear distortion in transmission power amplifier 6 is restrained, and adjacent channel leak power is reduced.

Figure 5:
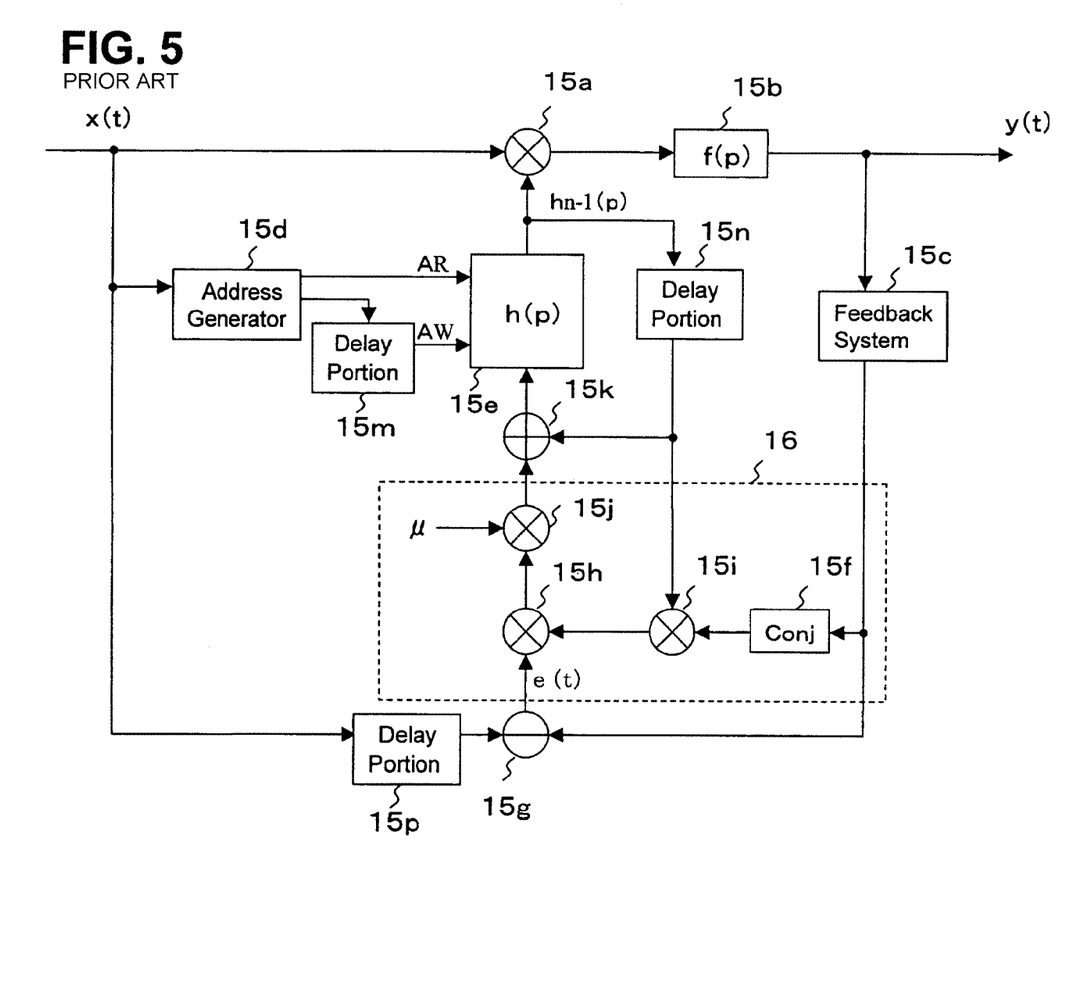
FIG. 5 shows a diagram illustrating a configuration of an embodiment of distortion compensator 9 shown in FIG. 4.

As a configuration of the embodiment of distortion compensator 9 shown in FIG. 4, a configuration example in case of performing distortion compensation using the adaptive LMS has been disclosed, as shown in FIG. 5, for example, in the PCT Internal Publication No. WO 03/103163.

In FIG. 5, a multiplier 15a corresponds to predistortion section 91 shown in FIG. 4, in which a transmission signal x(t) is multiplied by a distortion compensation coefficient $h_{n-1}(p)$. Also, a distortion device 15b having a distortion function f(p) corresponds to transmission power amplifier 6 shown in FIG. 4.

Also, a portion including frequency converter 11 in which the output signal from transmission power amplifier 15b is feedbacked, orthogonal detector 12 and A/D converter 13 shown in FIG. 4 is shown as a feedback system 15c in FIG. 5.

Further, in FIG. 5, distortion compensation coefficient storage 90 shown in FIG. 4 is constituted of a look-up table (LUT) 15e. Distortion compensation coefficient calculator 92 shown in FIG. 4 for generating an update value for the distortion compensation coefficient stored in look-up table 15e is constituted of a distortion compensation coefficient calculator 16 shown in FIG. 5.

In the distortion compensation apparatus having such the configuration shown in FIG. 5, look-up table 15e stores a distortion compensation coefficient for canceling the distortion of transmission power amplifier 6, a distortion device 15b, in a two-dimensional address position corresponding to each discrete power value of the transmission signal x(t).

When the transmission signal x(t) is input, an address generator 15d calculates the power $p(=x^2(t))$ of the transmission signal x(t), and generates an address in the direction of one dimension, for example, an address in the X-axis direction which uniquely corresponds to the calculated power $p(=x^2(t))$ of the transmission signal x(t). At the same time, address generator 15d obtains a difference ΔP from the power $P1(=x^2(t-1))$ of a transmission signal x(t−1) at the preceding time point (t−1) having been stored in address generator 15d. Address generator 15d then generates an address in the direction of another dimension, for example, in the Y-axis direction, which uniquely corresponds to the difference ΔP.

Accordingly, address generator 15d outputs the storage location of look-up table 15e being specified by both the address P in the X-axis direction and the address ΔP in the Y-axis direction, as specified information of a readout address (AR).

Thus, the distortion compensation coefficient $h_{n-1}(p)$ stored in the above readout address is read out from look-up table 15e, which is used for the distortion compensation processing in multiplier 15a.

Meanwhile, an update value for updating a distortion compensation coefficient stored in look-up table 15e is calculated in a distortion compensation coefficient calculator 16. More specifically, distortion compensation coefficient calculator 16 includes a conjugate complex signal output portion 15f, which outputs a conjugate complex signal y*(t), and multipliers 15h-15j. A subtractor 15g outputs a difference e(t) between the transmission signal x(t) and the feedback demodulation signal y(t). Multiplier 15i multiplies the distortion compensation coefficient $h_{n-1}(p)$ by y*(t), and obtains an output u*(t) $(=h_{n-1}(p)y*(t))$. Multiplier 15h multiplies the difference e(t) being output from subtractor 15g by u*(t). Multiplier 15j multiplies a step-size parameter μ by the output of multiplier 15h.

Subsequently, an adder 15k adds the distortion compensation coefficient $h_{n-1}(p)$ and the output of multiplier 15j, i.e. μe(t)u*(t), so as to obtain an update value of look-up table 15e. This update value is stored in the write address (AW) as an address corresponding to the power $p(=x^2(t))$ of the transmission signal, being specified by the address in the X-axis direction and the address in the Y-axis direction generated by address generator 15d.

Additionally, the readout address (AR) and the write address (AW) explained above is the same address. However, because a calculation time, etc. is required before obtaining the update value, the readout address being delayed in a delay portion 15m is used as write address.

Each delay portion 15m, 15n, 15p adds a delay time D to the transmission signal. Here, the delay time D denotes time duration from the time the transmission signal x(t) is input to the time the feedback demodulation signal y(t) is input to subtractor 15g. This delay time D to be set in each delay portion 15m, 15n, 15p is determined so as to satisfy D=D0+D1, where D0 is the delay time in transmission power amplifier 15b, and D1 is the delay time in feedback system 15c.

Using the above configuration, the following calculations are performed.

$$h_n(p)=h_{n-1}(p)+\mu e(t)u^*(t)$$

$$e(t)=x(t)-y(t)$$

$$y(t)=h_{n-1}(p)x(t)f(p)$$

$$u^*(t)=x(t)f(p)=h_{n-1}(p)y^*(t)$$

$$p=|x(t)|^2$$

Here, x, y, f, h, u and e are complex numbers, and * denotes a conjugate complex number.

Through the above calculation processing, the distortion compensation coefficient h(p) is updated so as to minimize the differential signal e(t) between the transmission signal x(t) and the feedback demodulation signal y(t). Finally, the value converges to an optimal distortion compensation coefficient, and the distortion of transmission power amplifier 6 is compensated.

Figure 6:
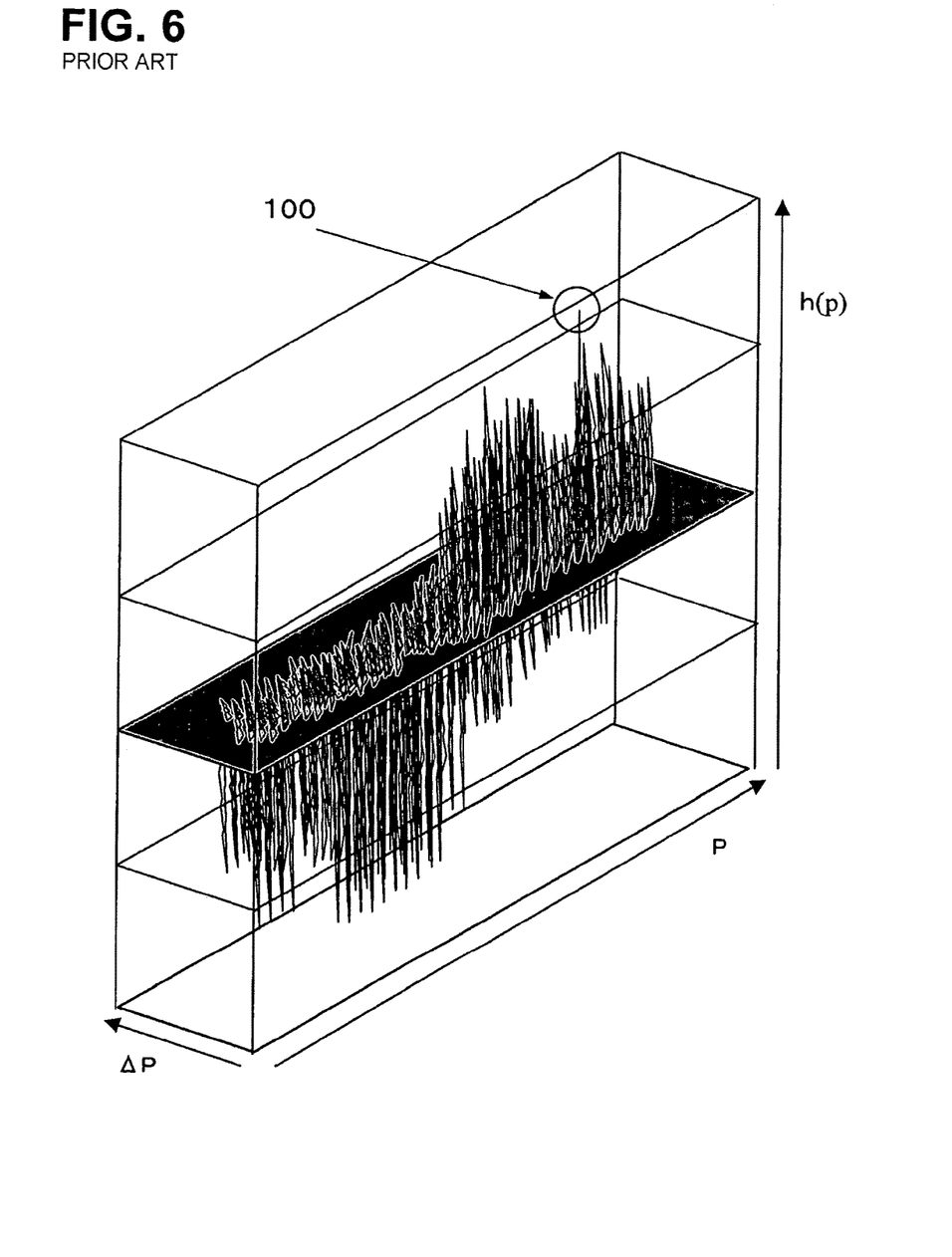
FIG. 6 shows a schematic diagram of the data in the real part side in distortion compensation coefficient storage 90 (refer to FIG. 4), or look-up table 15e shown in the example of FIG. 5, in which the above distortion compensation coefficient h(pi) is stored.

Now, FIG. 6 is a schematic diagram of the data in the real part side in distortion compensation coefficient storage 90 (refer to FIG. 4), or look-up table 15e shown in the example of FIG. 5, in which the above distortion compensation coefficient h(pi) is stored. A magnitude P is set to one axis direction out of the two dimensions, while a magnitude ΔP is set to the other axis direction. In the axis direction perpendicular to these axes, a distortion compensation coefficient value h(p) is expressed.

In FIG. 6, each peak which appears in places (as an example, a portion surrounded by a circle 100) is a portion in which a distortion compensation coefficient value h(p) becomes (or is becoming) an abnormal data (that is, h(p) having a large amplitude). The phenomenon of the above generation of the peaks is caused by the calculated update value of the distortion compensation coefficient becoming an abnormal value, when a large differential signal e(t) is produced by a largely varied feedback signal due to a large phase jitter, variation of the amplification characteristic, etc. in the analog portion including power amplifier 6.

If the predistortion processing is performed on the transmission signal, and the table update processing is performed, using such an abnormal value having the above-mentioned characteristic, the abnormal value in the table further produces an updated distortion compensation coefficient of an abnormal value. Finally, the distortion compensation coefficient diverges, bringing about an abnormal amplifier output as a result of the execution of the distortion compensation processing.

SUMMARY OF THE INVENTION

Accordingly, it is an object of the present invention to avoid divergence of the distortion compensation coefficient by detecting in early stages an abnormal value of the distortion compensation coefficient stored in a distortion compensation coefficient storage, and replacing with a mean value of the neighboring data before the abnormal value diverges.

As a first aspect of a distortion compensation apparatus according to the present invention to achieve the above object, a distortion compensation apparatus includes: a storage storing a distortion compensation coefficient in a specified write address, and outputting a distortion compensation coefficient stored in a specified readout address; a predistortion portion performing distortion compensation processing onto a transmission signal, using the distortion compensation coefficient being output from the storage; and a distortion compensator calculating a distortion compensation coefficient based on the transmission signal before the distortion compensation processing and the transmission signal after being amplified by an amplifier. The distortion compensator further reads out the distortion compensation coefficients stored in the storage, extracts a distortion compensation coefficient satisfying a predetermined condition, and performs correction processing for reducing the amplitude of the extracted distortion compensation coefficient. As the predetermined condition, existence of sufficiently large amplitude as compared to another distortion compensation coefficient being stored adjacently may be applied. The correction processing may be performed by making the distortion compensation coefficient approach the value of the other distortion compensation coefficient, using the other distortion compensation coefficient being stored adjacently. There may be provided alternate executions of a period for calculating the distortion compensation coefficient in the distortion compensator and for performing the distortion compensation processing onto the predistortion portion using the distortion compensation coefficient being read out from the storage, and a phase correction period for correcting a phase rotation of the transmission signal after being amplified by the amplifier. The above correction processing may be performed in the above phase correction period.

As a second aspect of the distortion compensation apparatus according to the present invention to achieve the aforementioned object, a distortion compensation includes: a storage storing a distortion compensation coefficient in a specified write address, and outputting a distortion compensation coefficient stored in a specified readout address; a predistortion portion performing distortion compensation processing onto a transmission signal, using the distortion compensation coefficient being output from the storage; a distortion compensator calculating a distortion compensation coefficient based on the transmission signal before the distortion compensation processing and the transmission signal after being amplified by an amplifier; and an address generator specifying a two-dimensional address of the storage, according to the transmission signal level before the distortion compensation processing. By grouping into each group having a predetermined number of distortion compensation coefficients stored in each series in the address direction of a second dimension out of the two-dimensional storage addresses, being located within a predetermined range in the address direction of a first dimension out of the two-dimensional storage addresses, the distortion compensator performs processing of replacing an abnormal value of the distortion compensation coefficients in the group by a mean value of other distortion compensation coefficients in the group of interest, successively for each group in the series.

As a third aspect of the distortion compensation apparatus according to the present invention to achieve the aforementioned object, a distortion compensation includes: a storage storing a distortion compensation coefficient in a specified write address, and outputting a distortion compensation coefficient stored in a specified readout address; a predistortion portion performing distortion compensation processing onto a transmission signal, using the distortion compensation coefficient being output from the storage; a distortion compensator calculating a distortion compensation coefficient based on the transmission signal before the distortion compensation processing and the transmission signal after being amplified by an amplifier; and an address generator specifying a two-dimensional address of the storage, according to the transmission signal level before the distortion compensation processing. For each series in the address direction of a second dimension out of the two-dimensional storage addresses, being located within a predetermined range in the address direction of a first dimension out of the two-dimensional storage addresses, the distortion compensator performs reading out the distortion compensation coefficients stored in the series of interest, and successively replacing, by a mean value, a distortion compensation coefficient exceeding an abnormal value decision criterion among the distortion compensation coefficients being read out. The mean value may be obtained from distortion compensation coefficients excluding a maximum value and an initial value among the distortion compensation coefficients being read out. Further scopes and features of the present invention will become more apparent by the following description of the embodiments with the accompanied drawings.

DETAILED DESCRIPTION OF THE INVENTION

The preferred embodiment of the present invention is described hereinafter referring to the charts and drawings. However, it is noted that the scope of the present invention is not limited to the embodiments described below.

Figure 7:
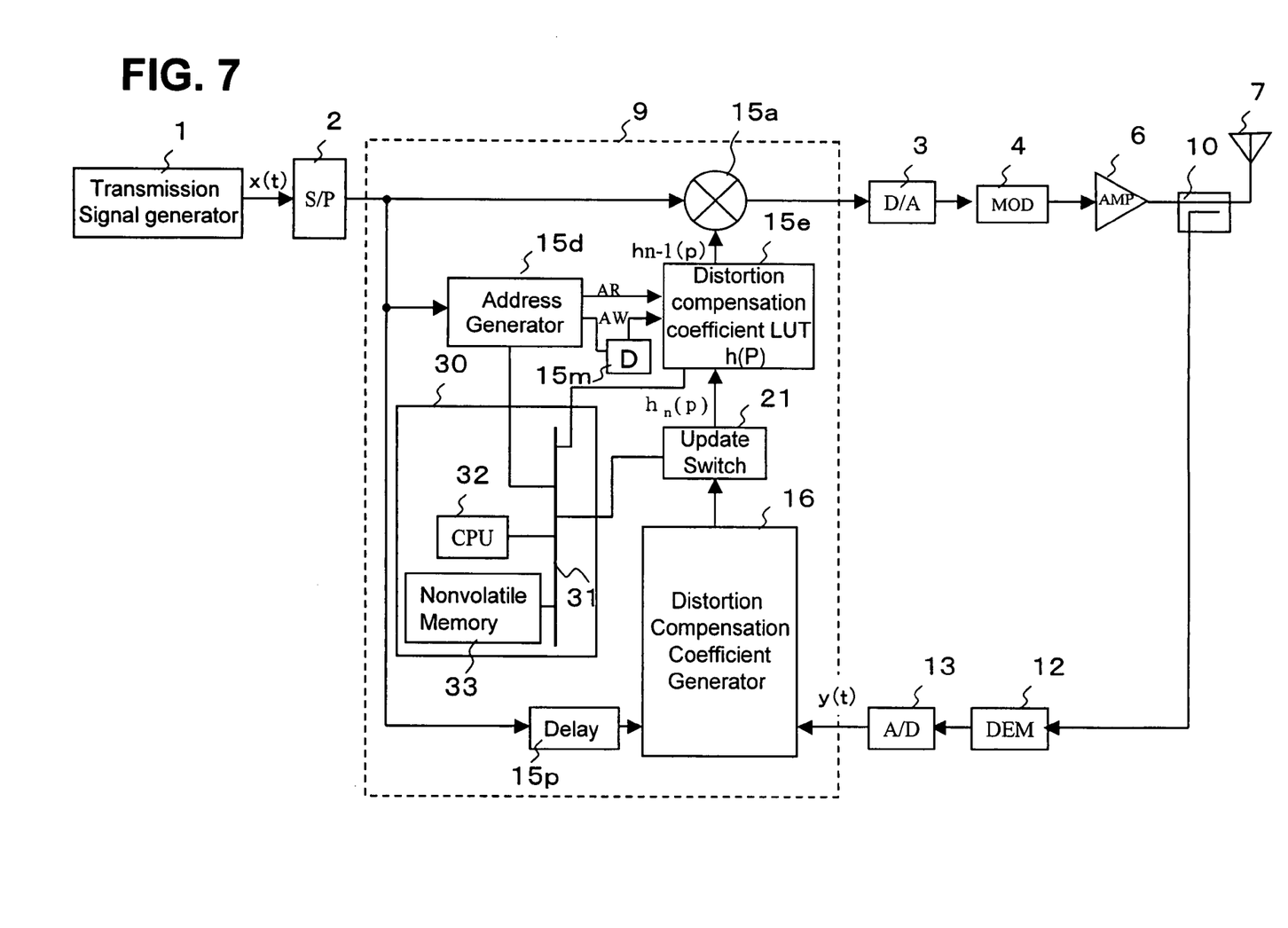
FIG. 7 shows a block diagram of an embodiment of the transmission equipment, configured of a distortion compensation apparatus having a digital nonlinear distortion compensation function according to the present invention

FIG. 7 is a block diagram of an embodiment of the transmission equipment, configured of a distortion compensation apparatus having a digital nonlinear distortion compensation function according to the present invention.

Here, like reference numerals refer to the portions having the like functions shown in FIGS. 4 and 5.

In FIG. 7, distortion compensator 9 includes a control block 30, and control block 30 includes a CPU 32 and a nonvolatile memory 33, which are connected to a bus 31. Further, a distortion compensation coefficient generator 16 works similarly to the circuit shown in FIG. 5. In the exemplary embodiment shown in FIG. 7, an update switch 21 is provided between distortion compensation coefficient generator 16 and a distortion compensation coefficient look-up table 15e storing distortion compensation coefficients.

As will be described later, this update switch 21 leads the distortion compensation coefficient generated in distortion compensation coefficient generator 16 to distortion compensation coefficient look-up table 15e during a timing period controlled by CPU 32. With this, the content of an address location specified by a write address AW is updated.

At the time of initial startup of distortion compensator 9, CPU 32 reads out an initial table value of the distortion compensation coefficient stored in nonvolatile memory 33, so as to store into look-up table 15e as an internal value. Here, the initial table value of the distortion compensation coefficient is, for example, a data having a predetermined value.

When the operation is started, as described earlier, a readout address AR corresponding to an input transmission signal is generated in address generator 15d, and the distortion compensation coefficient in the corresponding address is read out from look-up table 15e. The distortion compensation coefficient being read out is multiplied by the transmission signal in multiplier 15a.

Meanwhile, from a difference between a feedback signal y(t) and the transmission signal x(t), a distortion compensation coefficient for update is generated in distortion compensation coefficient generator 16. The generated distortion compensation coefficient for update is written into a write address AW of distortion compensation coefficient look-up table 15e corresponding to the readout address AR, through update switch 21. Thus, the distortion compensation coefficients are updated successively for each input transmission signal.

Here, the distortion compensation coefficients stored in distortion compensation coefficient look-up table 15e are as illustrated in FIG. 6. Accordingly, in the application of the present invention, CPU 32 in control block 30 detects abnormal peak values shown in FIG. 6 (as an example, the portion surrounded by circle 100 in FIG. 6), and corrects these abnormal values.

As an exemplary embodiment, a method for detecting and correcting abnormal peak portion of the distortion compensation coefficients is described below.

Figure 8:
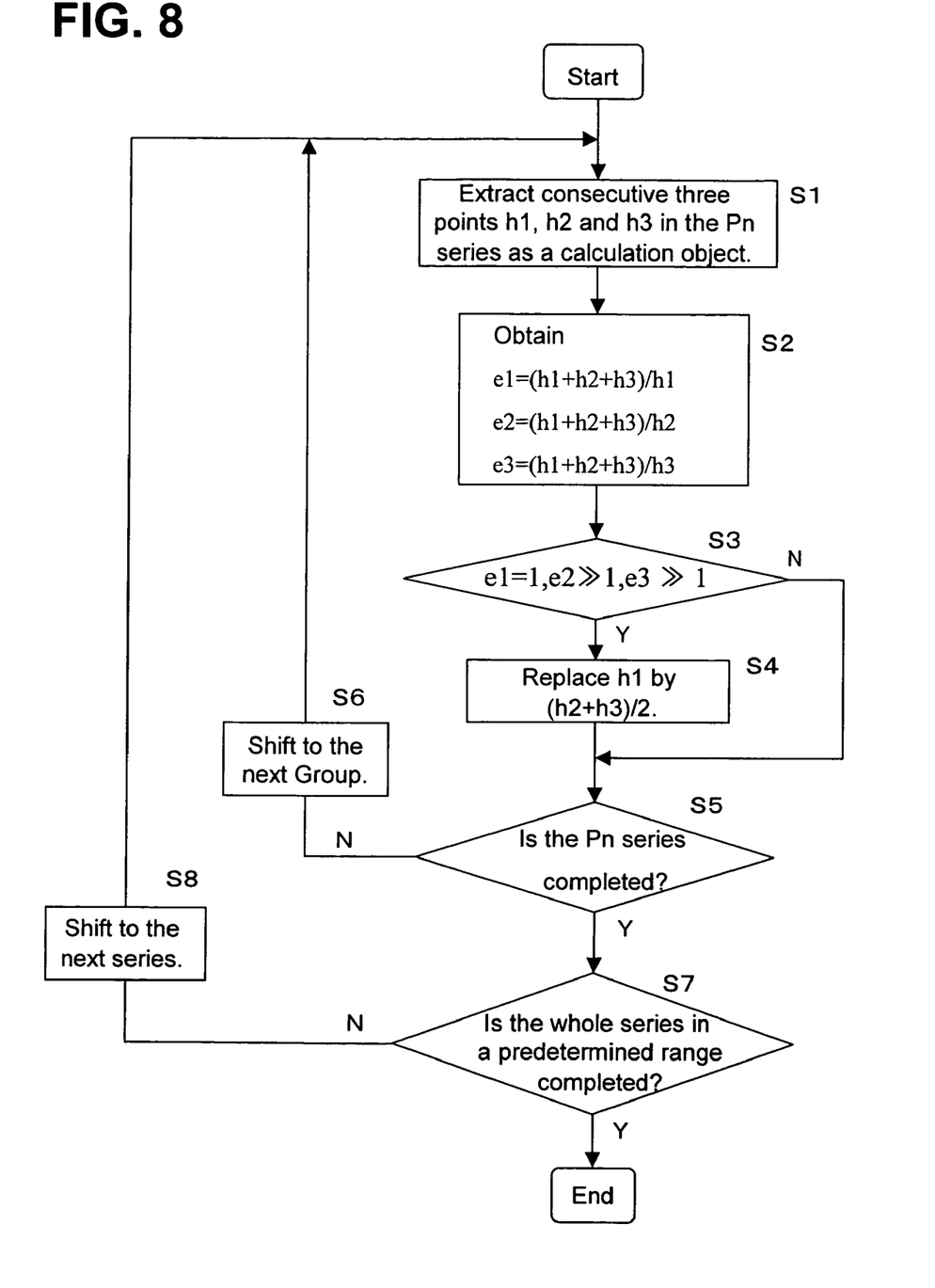
FIG. 8 shows a process flowchart illustrating a first method for detecting and correcting an abnormal peak portion.

FIG. 8 is a process flowchart illustrating a first method for detecting and correcting the abnormal peak portion. This process flow is performed under the control of CPU 32.

Figure 9:
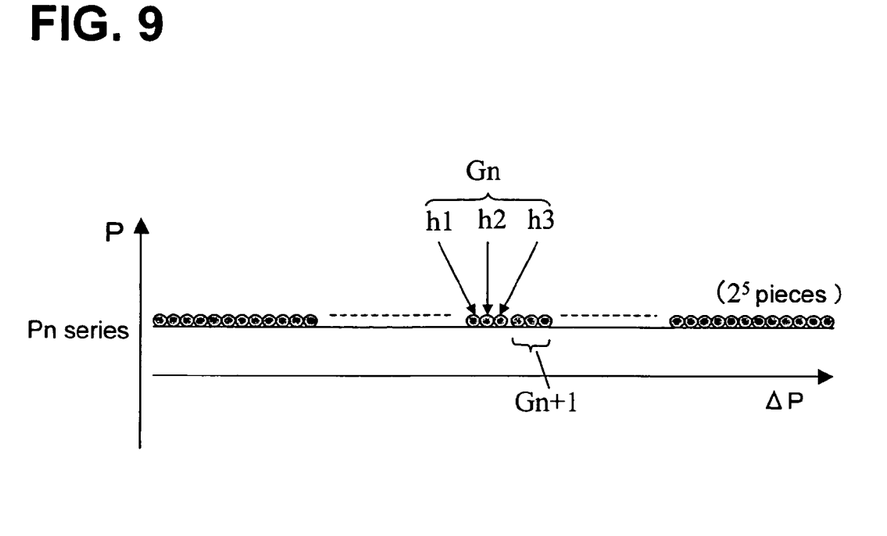
FIG. 9 shows a diagram illustrating step S1 in the flowchart shown in FIG. 8.

First, consecutive M (natural number more than 1) pieces of distortion compensation coefficients on a Pn series, as an example, h1, h2 and h3 in three (3) consecutive address locations are obtained, as one group of the distortion compensation coefficients. From an end portion of the Pn series, the above process is successively performed for each group (step S1). FIG. 9 is a diagram illustrating this state, in which the n-th group Gn including the distortion compensation coefficients h1, h2 and h3, in 3 consecutive address locations of the Pn series is shown, together with a group Gn+1 adjacent thereto.

Here, each h1-h3 may be a real part of the complex number h, or an imaginary part of h, or a square root of the sum of squares (amplitude) of the real part and the imaginary part of h, or the like. Here, the real part is applied in this example.

Referring back to FIG. 8, as to the n-th group Gn, the following calculation is performed (step S2).

$e1=(h1+h2+h3)/h1$ $e2=(h1+h2+h3)/h2$ $e3=(h1+h2+h3)/h3$

Here, $h1 \approx h2 \approx h3$ is satisfied when an abnormal value does not exist. As a result of integer calculation (calculation by rounding up or rounding down below the decimal point), each value 'en' (n=1, 2, 3) has 2 or 3. In contrast, when any abnormal value is existent, for example, when h1>>h2 and h1>>h3, then e1=1, e2>>1 and e3>>1. Thus, it is understood h1 is an abnormal value. For example, in case of a reference value being set to 5, when 'en' has the reference value 5 or more, the 'en' is detected as abnormal value.

Therefore, in FIG. 8, it is decided whether e1=1, e2>>1 (no less than 5) and e3>>1 (no less than 5) (step S3), if the above conditions are met, h1 is determined as an abnormal value. Then, this h1 is replaced by a mean value of the distortion compensation coefficients h2 and h3, that is, (h2+h3)/2 (step S4). The above process is also applied for detecting abnormal values in regard to e2 and e3.

Here, not only by using a mean value, divergence can also be suppressed if the abnormal value is replaced by a value near the adjacent value.

On completion of the process of detecting the abnormal value and replacing by the mean value in regard to the n-th group Gn, the process from the above steps S1 to S4 is executed as to the next (n+1)th group, Gn+1 (step S6, following N in step S5).

Next, on completion of the process of detecting the abnormal value and replacing by the mean value in regard to the series Pn (Y in step S5), the process proceeds for the next series (step S8). Preferably, the above process of detecting the abnormal value and replacing by the mean value are continued until the process completes for a predetermined range of series. On completion, the whole process is completed (step S7).

Here, in the above process of detecting the abnormal value and replacing by the mean value, the reason for limiting to a predetermined range, instead of processing through the entire range of the stored distortion compensation coefficients, is as follows:

In general, abnormal value of the distortion compensation coefficients tends to occur in such locations that a transmission signal level is large, or small, as compared to the average power. Therefore, from the viewpoint of efficiency, it is preferable to perform supervision and correction in concentration against abnormal values in a range portion either having a large transmission signal level or a small transmission signal level.

Needless to say, it is desirable to detect abnormality of h as to the range other than the above-mentioned predetermined range of the stored distortion compensation coefficients, at a rate of once for N-times (N is a plural number), in addition to periodically executing the process shown in FIG. 8. In this case, the predetermined range shown in FIG. 7 is modified to the range other than the predetermined range once for the N-times.

Further, the processing method shown in FIG. 8, i.e. a method of successively processing by grouping the Pn series into each group having a predetermined number of consecutive distortion compensation coefficients h1, h2, h3 is devised in consideration of the processing capacity of CPU 32.

The present invention is not limited to the method in the above embodiment example. Namely, as a second embodiment, it is also possible to employ a method according to the processing flowchart shown in FIG. 10.

Figure 10:
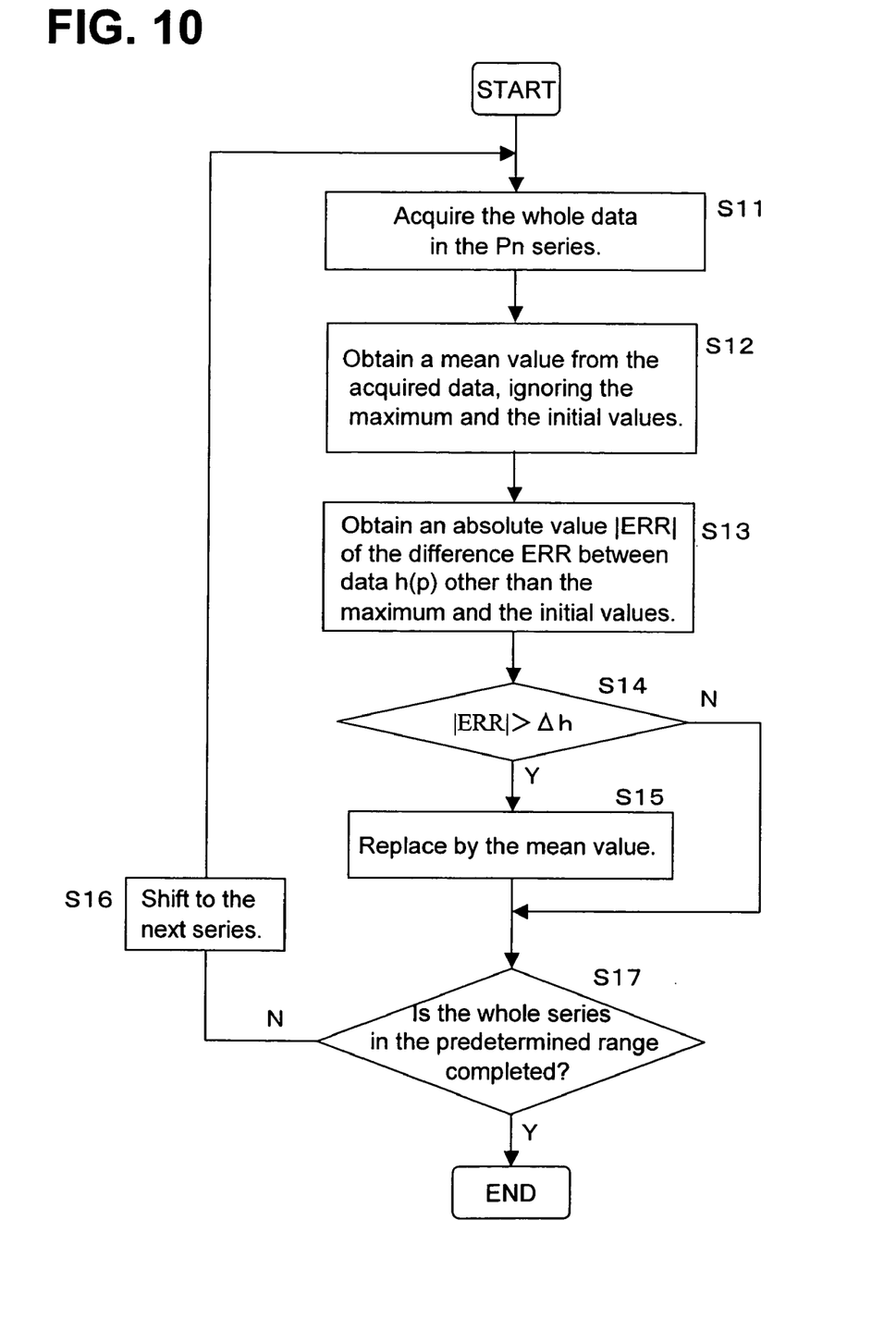
FIG. 10 shows a process flowchart illustrating a second method for detecting and correcting an abnormal peak portion.

Namely, FIG. 10 is a process flowchart illustrating the second method for detecting and correcting an abnormal peak portion. The feature of the second method is that the entire distortion compensation coefficient data in the Pn series are processed simultaneously.

In FIG. 10, first, the entire distortion compensation coefficient data in the Pn series are acquired (step S11). Next, from the acquired data, a mean value is obtained after both a maximum value and a value having no trace of being updated (i.e. an initial value) are ignored (omitted) (step S12). Here, since the initial value is a predetermined value, when the value matches the predetermined value, the value is regarded as initial value, and accordingly, the data can be ignored.

Figure 11A:
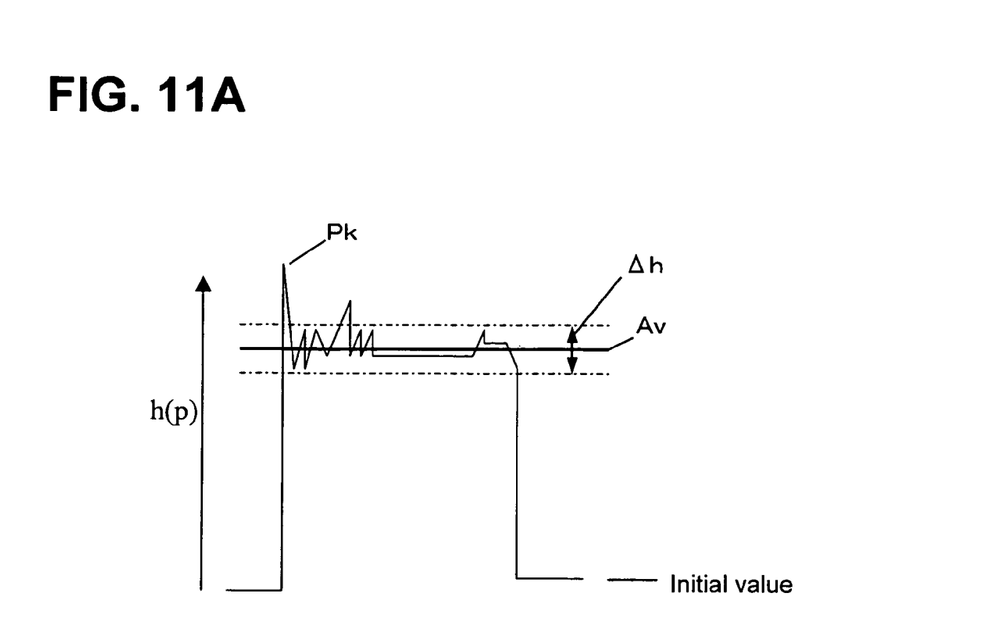
FIG. 11A shows a diagram illustrating states of the Pn series shown in FIG. 10, before the abnormal value detection.
Figure 11B:
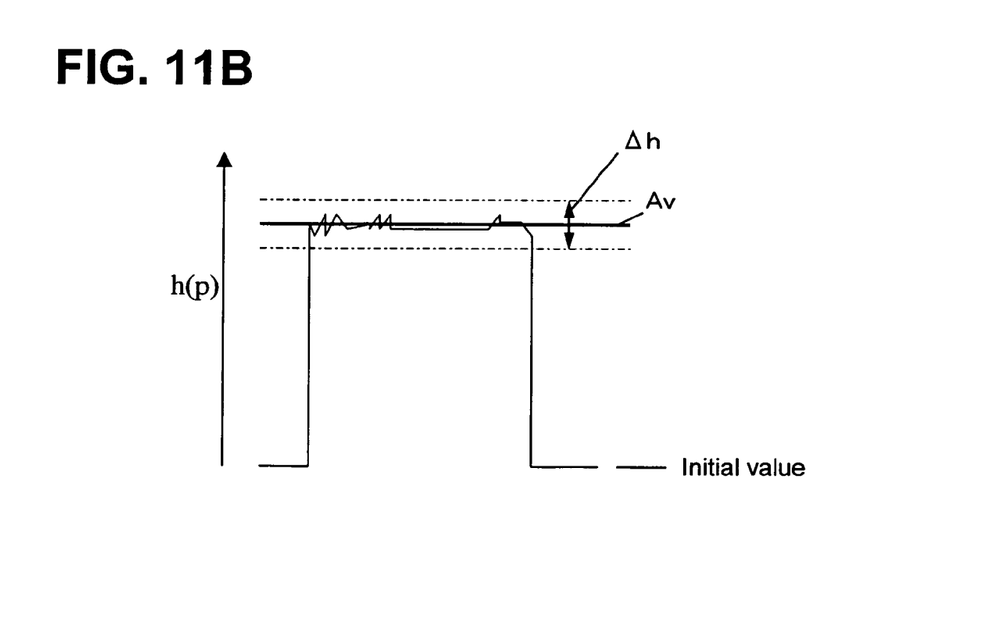
FIG. 11B shows a diagram illustrating states of the Pn series shown in FIG. 10, after the processing against the detected abnormal value.

FIGS. 11A, 11B are diagrams illustrating the above situations. FIG. 11A shows a situation before the abnormal value detection processing, while FIG. 11B shows a situation after the abnormal value processing. In these figures, the entire data locations in the Pn series are expressed in the horizontal (transverse) axis direction, and the magnitude of the distortion compensation coefficients are expressed in the vertical axis direction.

In FIG. 11A, 'Pk' is a maximum value of the entire distortion compensation coefficients in the Pn series. Also, 'Av' is a mean value being obtained after the maximum value and the initial value(s) are ignored.

Referring back to FIG. 10, subsequently, as for each data h(p) excluding the initial value(s), an absolute value |ERR|, where ERR indicates the difference of each data value from the mean value Av, is obtained (step S13). Then it is decided whether or not the |ERR| exceeds a range Δh (for example, 1,000) which is an abnormal value decision criterion (step S14).

If the |ERR| exceeds the criterion range Δh for deciding the abnormal value (Y in step S14), the data of interest is decided to be an abnormal value, and accordingly, the data of interest is replaced by the mean value Av (step S15).

On completion of the above process, the processing proceeds to the next series (step S16), and is repeated until the processing is completed for an arbitrary number of rows (step S17).

Here, the arbitrary number of rows is meant for the range of rows covering the object range, in which a region having a high occurrence frequency of the abnormal values is swept in the P direction.

Through the above process, it becomes possible to eliminate abnormal data in look-up table 15e, as shown in FIG. 11B.

Lastly, preferable execution timing of the processing shown in FIGS. 8 and 10 according to the present invention will be described below.

In regard to FIG. 5, it has been described before that the delay time D in delay portions 15m, 15n, 15p is determined so as to satisfy D=D0+D1. However, even when the delay time D is properly set, there may be cases that stable and satisfactory distortion compensation operation cannot be achieved, and as a result, wasteful outband radiation power is produced.

Such a case is produced by the occurrence of a clock jitter caused by a thermal noise, which is produced in the analog system including the D/A converter and the A/D converter, and other external disturbance. The clock jitter produces an abrupt variation in the phase of the feedback signal y(t), affecting the convergence of the distortion compensation coefficients.

The clock jitter produces an unstable period and repeated variations. Among others, a large phase variation is produced by a phase variation of a local signal used for the frequency converter. Caused by this, a phase $\phi$ of the feedback signal varies against the reference signal, as exemplarily shown in FIG. 12A.

When such a phase variation caused by the clock jitter is not considered, an unstable vibration occurs in the distortion compensation coefficients in the range of the phase variation. Since these distortion compensation coefficients are multiplied to the transmission signal, this causes generation of unwanted waves.

To cope with this problem, the applicant of the present invention has proposed an invention in the prior patent application (PCT Internal Publication No. WO 03/103163), which enables stable and satisfactory distortion compensation operation even a phase difference between a reference signal and a feedback signal varies caused by a jitter, etc.

Figure 12A:
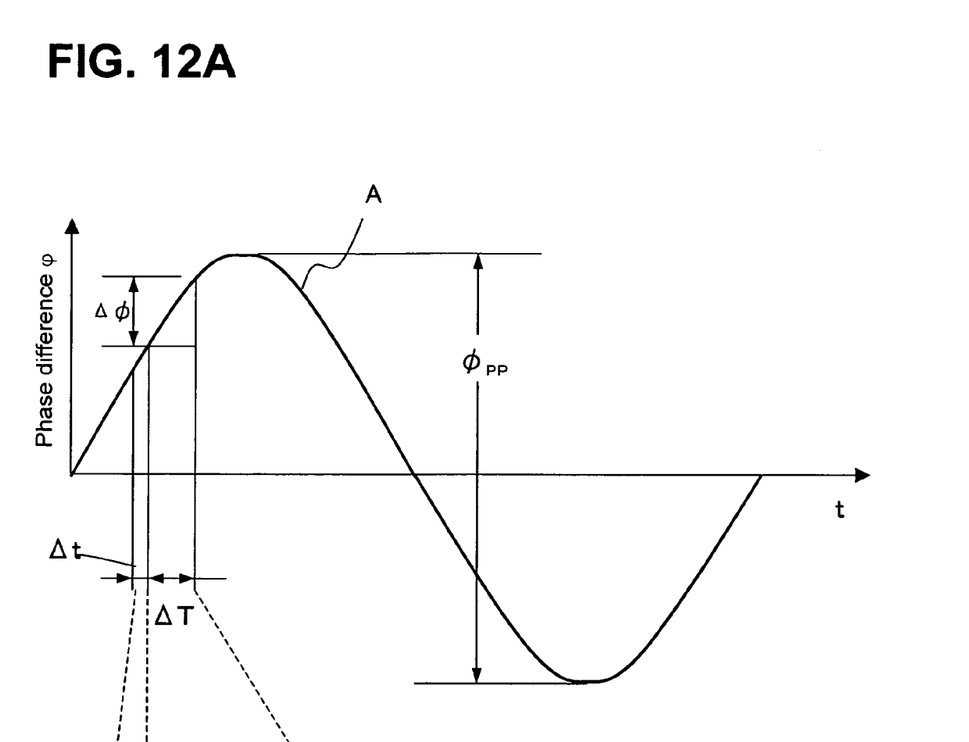
FIG. 12A shows an explanation diagram of variation of phase $\phi$ in a feedback signal to a reference signal.

In FIG. 12A, it is assumed that a phase difference occurs between a reference signal (transmission signal) and a feedback signal caused by a clock jitter, as shown by a symbol A. In this case, if it is intended to correct this phase difference by detecting the phase difference between the reference signal and the feedback signal, the phase correction cannot follow a rapid phase variation caused by the jitter.

As a result, even if the phase correction is performed and look-up table 15e of the distortion compensation coefficients is updated, the distortion compensation coefficient does not converge stably, affected by the phase difference $\phi_{PP}$. Therefore, it is difficult to obtain satisfactory distortion compensation operation. To cope with this problem, in the prior patent application described above, an intermittent controller is provided, by which a phase correction period Δt and a distortion compensation coefficient update period ΔT are generated.

The phase difference $\phi$ between the reference signal and the feedback signal is corrected in the phase correction period Δt. Also, the distortion compensation coefficient is updated in the distortion compensation coefficient update period ΔT. The above operation is repeated thereafter.

Figure 12B:
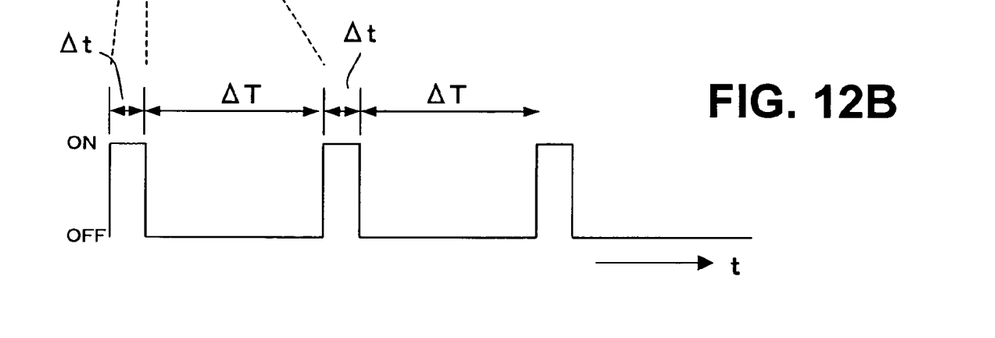
FIG. 12B shows an explanation diagram of alternate occurrence of each phase correction period $\Delta t$ and each distortion compensation coefficient update period $\Delta T$ by means of an intermittent controller.

Accordingly, when applying the present invention also, as disclosed in the above prior patent application, a timing signal specifying the phase correction period Δt and the distortion compensation coefficient update period ΔT is generated by CPU 32. Further, by means of a distortion compensation coefficient generator 16, in this phase correction period Δt, the phase correction is performed. Also, the abnormal value detection of the distortion compensation coefficient and the replacement processing using the mean value in accordance with the present invention are performed as well.

Meanwhile, in the distortion compensation coefficient update period ΔT, by writing into look-up table 15e, distortion compensation coefficient generator 16 updates the distortion compensation coefficient value being generated based on the difference between the reference signal and the feedback signal, while an update switch 21 is switched on.

As such, by repeating update and correction of the look-up table values continuously in a substantially short time, it becomes possible to effectively obtain an effect of eliminating abnormal values.

To summarize, according to the present invention, an abnormal value of the distortion compensation coefficient stored in a distortion compensation coefficient storage can be detected accurately, and the value can be restored to a mean value. Thus, it becomes possible to prevent divergence of the distortion compensation coefficient stored in the distortion compensation coefficient storage.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A distortion compensation apparatus comprising:
    a storage to store distortion compensation coefficients in respective, specified write addresses;
    a predistortion portion to perform distortion compensation processing onto a transmission signal, using a distortion compensation coefficient being output from the storage;
    a distortion compensator to calculate a difference between said transmission signal before the distortion compensation processing and the transmission signal after being amplified by an amplifier to update the distortion compensation coefficient being output from the storage so that the difference becomes zero; and
    a processing unit to extract a distortion compensation coefficient stored in the storage, satisfying a predetermined condition, and to perform correction processing for reducing the amplitude of said extracted distortion compensation coefficient.

2. The distortion compensation apparatus according to claim 1, wherein,
    the predetermined condition is determined when e1=1, e2>>1, e3>>1, where e1=(h1+h2+h3)/h1, e2=(h1+h2+h3)/h2, and e3=(h1+h2+h3)/h3, considered as h1 for the extracted distortion compensation coefficient, and h2 and h3 respectively for distortion compensation coefficients being stored at adjacent addresses in the storage.

3. The distortion compensation apparatus according to claim 1,
    Wherein the distortion compensator further corrects a phase rotation of the transmission signal after being amplified by the amplifier; and
    a period for calculating and updating the distortion compensation coefficient by the distortion compensator and for performing the distortion compensation processing by the predistortion portion, and a phase correction period for correcting a phase rotation of the transmission signal by the distortion compensator are alternatively set, and the correction processing by the processing unit is performed in the phase correction period.

4. The distortion compensation apparatus according to claim 2,
    wherein the processing unit reduces the amplitude of the extracted distortion compensation coefficient h1 so as to approach to the value of said other distortion compensation coefficients h2 and h3.

5. A distortion compensation apparatus comprising:
    a storage to store distortion compensation coefficients in write addresses respectively specified by each set of X-axis direction and Y-axis direction addresses;
    a predistortion portion performing to perform distortion compensation processing onto a transmission signal, using a distortion compensation coefficient being output from the storage;
    a distortion compensator to calculate a difference between said transmission signal before the distortion compensation processing and the transmission signal after being amplified by an amplifier to update the distortion compensation coefficient being output from the storage so that the difference becomes zero;
    an address generator to specify a set of X-axis direction and Y-axis direction addresses of the storage, according to the transmission signal level before the distortion compensation processing; and
    a processing unit to make in a group, a predetermined number of distortion compensation coefficients stored at respective Y-axis direction addresses within a certain range of the X-axis direction addresses in the storage, and to replace an abnormal value of the distortion compensation coefficients in the group with a mean value of other distortion compensation coefficients in sequentially stored at the certain range of the X-axis direction addresses.

6. A distortion compensation apparatus comprising:
    a storage to store distortion compensation coefficients in write addresses respectively specified by each set of X-axis and Y-axis direction addresses;
    a predistortion portion performing to perform distortion compensation processing onto a transmission signal, using a distortion compensation coefficient being output from the storage;
    a distortion compensator to calculate a difference between said transmission signal before the distortion compensation processing and the transmission signal after being amplified by an amplifier to update the distortion compensation coefficient being output from the storage so that the difference becomes zero;
    an address generator to specify a set of column and row addresses of the storage, according to the transmission signal level before the distortion compensation processing; and
    a processing unit to read out distortion compensation coefficients stored at respective column addresses within a certain range of Y-axis direction addresses in the storage, and to replace a distortion compensation coefficient exceeding a threshold value with a mean value of other distortion compensation coefficients in sequentially stored at the certain range of X-axis direction addresses.

7. The distortion compensation apparatus according to claim 6,
    wherein the mean value is obtained from distortion compensation coefficients excluding a maximum value and an initial value among the distortion compensation coefficients being read out.

\* \* \* \* \*